United States Patent
Kannan et al.

(10) Patent No.: US 7,353,485 B1
(45) Date of Patent: Apr. 1, 2008

(54) METHOD OF FLEXIBLE CLOCK PLACEMENT FOR INTEGRATED CIRCUIT DESIGNS USING INTEGER LINEAR PROGRAMMING

(75) Inventors: Parivallal Kannan, Longmont, CO (US); Victor Z. Slonim, Broomfield, CO (US); Salim Abid, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 429 days.

(21) Appl. No.: 11/200,627

(22) Filed: Aug. 10, 2005

(51) Int. Cl.
*G06F 17/50* (2006.01)
(52) U.S. Cl. ...................................................... 716/16
(58) Field of Classification Search .................... 716/16
See application file for complete search history.

(56) References Cited

U.S. PATENT DOCUMENTS 5,555,188 A * 9/1996 Chakradhar .................... 716/6
7,017,043 B1 * 3/2006 Potkonjak .................... 713/176
7,207,024 B2 * 4/2007 Scheffer ........................ 716/11
2007/0204252 A1 * 8/2007 Furnish et al. ................. 716/10

OTHER PUBLICATIONS

U.S. Appl. No. 11/135,980, filed May 24, 2005, Slonim et al.

* cited by examiner

*Primary Examiner*—Jack Chiang
*Assistant Examiner*—Brandon Bowers
(74) *Attorney, Agent, or Firm*—Kevin T. Cuenot

(57) ABSTRACT

A method of global clock placement for a circuit design to be implemented on a programmable logic device (PLD) can include identifying clock properties for the circuit design and identifying physical clock region attributes for the PLD. The method further can include specifying an Integer Linear Programming formulation (ILP) of a clock placement problem for the circuit design from the clock properties and the physical clock region attributes. The ILP formulation can be solved to determine whether a feasible clock placement exists for the circuit design.

20 Claims, 1 Drawing Sheet

METHOD OF FLEXIBLE CLOCK PLACEMENT FOR INTEGRATED CIRCUIT DESIGNS USING INTEGER LINEAR PROGRAMMING

BACKGROUND

1. Field of the Invention

This invention relates to the field of integrated circuits and, more particularly, to the allocation of global clock networks to physical clock regions of a programmable logic device.

2. Description of the Related Art

Modern programmable logic devices (PLDs), and particularly field programmable gate arrays (FPGAs), utilize a plurality of optimized global clock trees. Global clock trees also can be referred to as differential global clock trees, global clock lines, matched skew global clock lines, global clock interconnects, global clock network resources, or global clock spines. In any case, these global clock trees are responsible for reliably clocking sequential logic components of the PLD. Global clock trees require a significant amount of device area, or silicon, to implement and also require a substantial amount of operating power in the field. In consequence, most FPGAs include a limited number of global clock trees. The trend in modern circuit design, however, is tending toward the use of increased numbers of global clock networks in circuit designs.

The concept of clock regions was introduced to circuit design as a mechanism for dealing with the high cost of implementing global clock trees and the demand for more global clock networks per device. Clock regions are non-overlapping areas of a PLD which, typically, are rectangular in shape. Each clock region can accommodate a fixed number of logic components and support a fixed number of global clock trees. The number of global clock trees supported by a clock region usually is less than the available global clock drivers within the PLD.

In illustration, a Virtex™-4 FPGA from Xilinx, Inc. of San Jose, Calif., has clock regions of fixed dimensions. In terms of size, the clock regions span 16 configurable logic blocks (CLBs) in height and half of the die in width. By fixing the dimensions of the clock regions, larger Virtex™-4 devices can have a greater number of clock regions. With a greater number of clock regions, Virtex™-4 devices can support a greater number of multi-clock domains than otherwise would be possible.

In general, only a subset of the total clock drivers of a PLD can be included within a given clock region. Thus, only the clock drivers associated with a given clock region are available to drive global clock trees within that clock region. The number of global clock drivers "k" that can be included within each clock region of a device is largely device-architecture dependent. Thus, for a given device architecture, a "k-clock" policy can be specified which allows only "k" clock drivers to drive the global clock trees within a given clock region. Again referring to the Virtex™-4 FPGA, this device has 8 global clock trees per clock region. Any 8 of the 32 clock drivers of the device can be used to drive the global clock trees in a given clock region.

Once clock drivers are allocated, sequential circuit elements must be assigned to the clock regions. The circuit elements must be assigned in a manner that complies with the logic capacity of each clock region as well as the k-clock constraints for the device. This process is referred to as the "clock placement problem". The clock placement problem is believed to be an NP-Complete problem. In computational complexity theory, Non-deterministic Polynomial time (NP) is the set of decision problems solvable in polynomial time on a non-deterministic Turing machine.

Conventional techniques for solving the clock placement problem are based upon approximation algorithms or heuristic algorithms. Generally, approximation and heuristic algorithms can find a sub-optimal solution for a given problem in a relatively short time period. Unlike heuristic algorithms, approximation algorithms can operate within provable runtime bounds and provide a result that has a provable quality. Both approaches, however, are non-exact and often fail to produce a feasible solution for the clock placement problem. In consequence, PLD designers usually perform a manual floor-planning for the circuit design, which is cumbersome and time-consuming. With designs continuing to utilize larger numbers of global clock networks, clock placement is likely to become a hindrance to rapid circuit design.

It would be beneficial to provide a technique for addressing the clock placement problem which overcomes the limitations described above.

SUMMARY OF THE INVENTION

The present invention provides methods for flexible clock placement for use with integrated circuits. One embodiment of the present invention can include a method of global clock placement for a circuit design to be implemented on a programmable logic device (PLD). The method can include identifying properties of a plurality of global clock networks for the circuit design and identifying attributes of a plurality of physical clock regions for the PLD. An Integer Linear Programming (ILP) formulation of a clock placement problem for the circuit design can be specified. The ILP formulation can be determined according to the properties of the plurality of global clock networks and the attributes of the plurality of physical clock regions. The ILP formulation can be solved to determine whether a feasible clock placement exists for the circuit design.

The properties of the plurality of global clock networks for the circuit design can include, but are not limited to, a total number of global clock networks in the circuit design, a number of loads for each global clock network, different types of loads for each global clock network, and/or a total number of components in the circuit design. The specifying step further can include defining the ILP formulation to depend upon an objective function which minimizes physical clock regions used by all global clock networks of the circuit design.

The method can include defining at least one virtual clock region which comprises at least one physical clock region, wherein the ILP formulation minimizes physical clock regions included within each virtual clock region. Each virtual clock region can be mapped to 0 or more of the plurality of physical clock regions if a feasible clock placement exists for the circuit design. In another embodiment, the specifying step can include defining the ILP formulation to depend upon an objective function comprising a sum of a first and a second function. The first function can minimize a total number of physical clock regions and the second function can minimize virtual clock regions used by global clock networks of the circuit design. The second function can include a coefficient which regulates distribution of global clock networks among the plurality of physical clock regions of the PLD.

Another embodiment of the present invention can include a method of global clock placement for a circuit design to be implemented on a PLD. The method can include creating virtual clock regions according to clock properties of the circuit design and defining an ILP formulation of a clock placement problem for the circuit design. The ILP formulation can be defined according to clock properties of the circuit design and attributes of physical clock regions of the PLD. The method further can include solving the ILP formulation by minimizing an objective function to determine feasibility of global clock placement for the circuit design. The objective function can depend upon a sum of the physical clock regions of the PLD within each virtual clock region of the circuit design.

The objective function can depend upon a sum of a first and a second function. The first function can minimize the sum of the physical clock regions of the PLD within each virtual clock region of the circuit design. The second function can minimize a sum of virtual clock regions used by global clock networks of the circuit design. The method also can include mapping each virtual clock region to zero or more physical clock regions of a set of physical clock regions for the PLD if a feasible clock placement exists for the circuit design.

Yet another embodiment of the present invention can include a method of assigning clocks to physical clock regions for a circuit design to be implemented on a PLD. The method can include identifying clock properties for the circuit design and physical clock region attributes for the PLD. Virtual clock regions can be created according to clock properties of the circuit design. A plurality of ILP constraints for determining feasibility of clock placement for the circuit design can be specified. The ILP constraints can be specified according to the clock properties and the physical clock region attributes. An objective function can be solved according to the ILP constraints to determine the feasibility of clock placement for the circuit design in relation to the PLD.

One ILP constraint can be defined as $$\sum_{j=1}^{M_D} n_{ij}^k = A_i^k, \forall k, i,$$

where $A_i^k$ represents a number of clock loads of a type k belonging to a clock network i, $n_{ij}^k$ represents a number of clock loads of a type k driven by a clock driver i in a virtual clock region j, and $M_D$ represents a number of global clock networks in the circuit design. Another ILP constraint can be defined as $$\sum_{j=1}^{M_D} n_{ij}^k \leq T_k Y_j, \forall k, j,$$

where $Y_j$ represents a number of physical clock regions comprising a virtual clock region j and $T_k$ represents a number of available sites of a type k within a specified physical clock region.

Another ILP constraint can be defined as $$\sum_{j=1}^{M_D} X_{ij} \geq 1, \forall i,$$

where $X_{ij}$ is a binary variable representing a presence of any component driven by a clock network i in a virtual clock region j. A further ILP constraint can be defined as $$\sum_{j=1}^{M_D} X_{ij} \leq N_C, \forall j,$$

wherein $N_C$ represents a maximum number of global clock trees allowed in a physical clock region. Yet another ILP constraint can be defined as $$q \sum_k n_{ij}^k \geq q X_{ij} \geq \sum_k n_{ij}^k, \forall i, j,$$

where q is a positive integer. Additional ILP constraints can include, but are not limited $$\text{to, } n_{ij}^k, Y_j \in Z, n_{ij}^k, Y_j \geq 0,$$

and $X_{ij} \in \{0,1\}$, where Z is the set of integers.

The objective function can be denoted as F and defined as $$F = \left[ \min \sum_{j=1}^{M_D} Y_j \right] + c \left[ \min \sum_{i=1}^{M_D} \sum_{j=1}^{M_D} X_{ij} \right],$$

, where c is a constant which regulates distribution of clocks of the circuit design among physical clock regions of the PLD. In one embodiment, c can be set equal to 0, which removes the second function $$\left[ \min \sum_{i=1}^{M_D} \sum_{j=1}^{M_D} X_{ij} \right]$$

from the objective function or a positive quantity. The method further can include determining that clock placement for the circuit design is feasible if a solution for the objective function F satisfies $\Sigma Y_j \leq N_R$, where $N_R$ represents a number of physical clock regions in the PLD.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Figure 1:
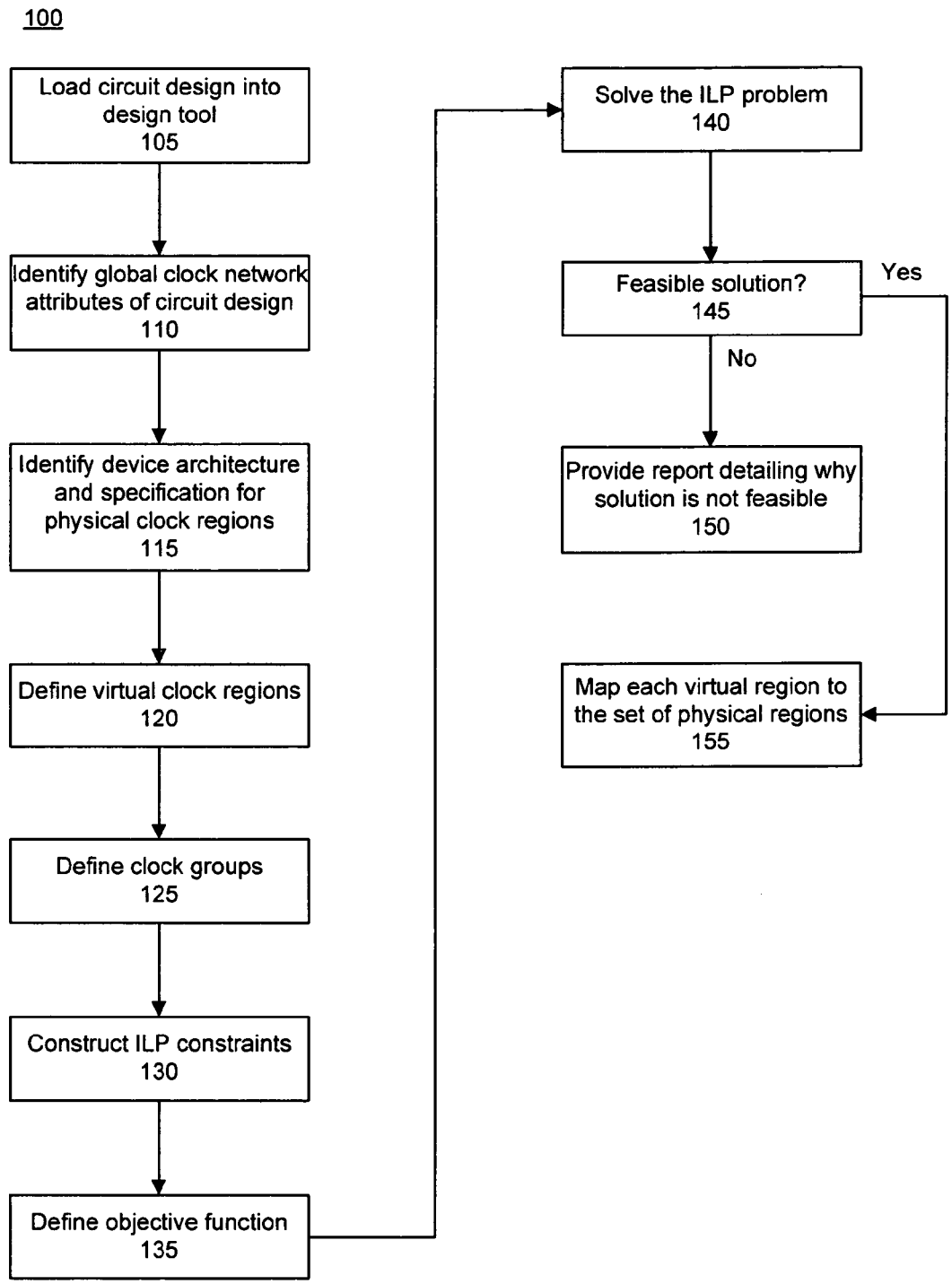
FIG. 1 is a flow chart illustrating a method of determining feasibility of clock placement for a circuit design and for determining clock region assignments in accordance with the inventive arrangements disclosed herein.

The present invention provides methods for placing global clocks within programmable logic devices (PLDs). In accordance with the present invention, Integer Linear Programming (ILP) is used to formulate a potential solution to the clock placement problem for a given circuit design. More particularly, the feasibility of the clock placement problem can be determined for a given circuit design. The feasibility of the clock placement problem can be determined in light of any defined constraints, particularly those relating to compatibility and/or capacity of the PLD in which the circuit design is to be implemented. If clock placement is feasible, a valid assignment of global clock networks to clock regions can be determined for the circuit design.

FIG. 1 is a flow chart illustrating a method 100 of determining the feasibility of clock placement for a circuit design and for determining clock region assignments in accordance with the inventive arrangements disclosed herein. In one embodiment, the steps described herein in reference to method 100 can be implemented within a software-based design tool executing within a suitable information processing system. As known, such design tools can operate upon netlists or other software-based representations of circuit designs such as those expressed using a hardware description language. Thus, in step 105, a circuit design for an integrated circuit, or a portion thereof, can be loaded into a design tool. While the circuit design can be for any of a variety of different PLDs, in one embodiment, the circuit design can be for a field programmable gate array (FPGA).

In step 110, the clock attributes of the circuit design can be identified. Clock attributes can include, but are not limited to, the number of global clock networks in the circuit design, the number of loads for each global clock network, the different load types for each global clock network, as well as the total number of components in the circuit design. The number of global clock networks in the circuit design can be denoted as $M_D$. Each global clock network in the circuit design can be assumed to require one clock driver of the physical device, or PLD. Thus, $M_D$ is effectively constrained by $M_D \leq N_D$ where $N_D$ is the number of clock drivers in the PLD. The total number of components in the circuit design can be denoted as $M_L$.

In step 115, the device architecture and, particularly, the specification for the physical clock regions of the PLD can be identified. The specification describes the device characteristics which relate to the physical clock regions of the device. The characteristics can be manually entered into the design tool or can be stored within a library of different device characteristics which can be accessed after the PLD is identified to the design tool.

In any case, the physical clock region characteristics that are identified by the design tool can include, but are not limited to, the set of physical clock regions available on the PLD, the geographic layout of the physical clock regions with respect to the PLD, the set of clock drivers available on the PLD, the number of global clock trees available in a given physical clock region, the number of distinct clock load types supported by the device, as well as the number of available site types in a given physical clock region.

The set of physical clock regions available on the device can be denoted as R. Accordingly, the number of physical clock regions on the device can be denoted as $N_R=|R|$. In one embodiment of the present invention, the physical clock regions can be defined as rectangular regions which do not overlap one another. The size of the physical clock regions can be determined. The set of clock drivers available within the PLD can be denoted as D and the number of clock drivers available on the PLD can be expressed as $N_D=|D|$. The number of global clock trees available in a given physical clock region can be expressed as $N_C$. Accordingly, the total number of global clock trees available on the PLD also can be ascertained.

The set of distinct clock load types in the device can be denoted as T. The number of available sites of type k within a specified physical clock region can be expressed as $T_k$, where $k \in T$. For example, available site types can include, but are not limited to, block RAMs, multipliers, slices, and the like. In accordance with one embodiment of the present invention, it can be assumed that each physical clock region of the PLD is the same in terms of the number of sites available. In illustration, a Virtex-4 series FPGA available from Xilinx, Inc. would have $N_D=32$, $N_R \geq 8$, $N_C=8$, and $|T|=6$. $T_k$ is device dependent but remains constant for a given PLD.

In step 120, virtual clock regions can be defined. In general, each virtual clock region, denoted as $V_j$, can function as an aggregate of several physical clock regions. The number of distinct global clock networks within a virtual clock region is limited to the total number of global clock trees available within a physical clock region $N_C$. The creation of virtual clock regions is a technique which effectively relaxes the logic capacity constraints of a physical clock region while maintaining constraints on the number of global clock trees. Initially, the number of virtual clock regions can be set to the same value as the number of clock drivers $M_D$ in the circuit design. Thus, $|V|$ is set equal to $M_D$. Using this initial constraint, the existence of a solution for an ILP formulation of the clock placement problem is guaranteed. Such a solution, however, is not necessarily feasible.

In step 125, one or more clock groups can be defined. The clock groups are groups or classifications of the various objects, or clock loads, of the circuit design. The objects can be classified based upon the type of each object and the clock network driving each object. The objects can be classified into clock groups denoted as $A_i^k$, where each clock group represents a number of design objects of type k driven by a clock network i. As noted, in terms of load type, it can be said that $k \in T$, where T represents the set of distinct clock load types, or sites, available within the PLD. The different clock load types refer to the sequential logic of the circuit design that will be implemented within the PLD.

Beginning in step 130, an ILP formulation for the clock placement problem can be constructed. In step 130, ILP constraints for solving the clock placement problem can be defined. Recalling that the number of loads of type k belonging to a clock network i can be denoted as $A_i^k$, one ILP constraint is that the total number of components of type k that belong to a clock network i in all the virtual clock regions also is equal to $A_i^k$. This constraint can be expressed as $$\sum_{i=1}^{M_D} n_{ij}^k = A_i^k, \forall k, i, \text{ where } n_{ij}^k$$

represents the number of clock loads of type k driven by clock driver i in a given virtual clock region j.

Another ILP constraint is that the total number of components of type k in a virtual clock region used by all the global clock networks in the design must be less than $T_k$ times the number of clock regions comprising the virtual clock region. Recall that $T_k$ represents the number of available sites of type k within a specified physical clock region. This constraint can be expressed as $$\sum_{i=1}^{M_D} n_{ij}^k \leq T_k Y_j, \forall k, j, \text{ where } Y_j$$

represents the number of physical clock regions comprising the virtual clock region j. The bounds for $Y_j$ can be determined such that if $Y_j=0$, the virtual clock region $V_j$ is unused and unnecessary for the clock placement solution. If $Y_j=N_R$, the virtual clock region $V_j$ is as large as the entire PLD. Since the entire circuit design must fit on the PLD, the upper bound for $Y_j$ is reasonable. Thus, it can be said that $0 \leq Y_j \leq N_R, \forall j$.

A next ILP constraint is that the components of a clock network i must be present in at least one virtual clock region. This constraint can be expressed as $$\sum_{j=1}^{M_D} X_{ij} \geq 1, \forall i, \text{ where } X_{ij} \in \{0, 1\}.$$

Here, $X_{ij}$ is a binary variable which represents the presence of any component, or load, driven by a clock network i in the virtual clock region j. In more formal terms, $X_{ij}$ can be expressed as follows: $X_{ij}=0$, iff $$\forall_{k \in T} n_{ij}^k = 0 \text{ and } X_{ij} = 1, \text{ iff } \exists_{k \in T} n_{ij}^k > 0.$$

Another ILP constraint is that the number of distinct clock networks driving at least one component in a virtual clock region must be less than or equal to $N_C$, which represents the maximum number of clock trees allowed in a physical clock region. The constraint is derived from the clock region definition, which effectively restricts the number of clock networks permitted in a physical clock region. This constraint can be expressed as $$\sum_{i=1}^{M_D} X_{ij} \leq N_C, \forall j.$$

An additional ILP constraint is the establishment of a linear relationship between $X_{ij}$ and $n_{ij}^k$. This constraint can be expressed as $$q \sum_k n_{ij}^k \geq q X_{ij} \geq \sum_k n_{ij}^k, \forall i, j.$$

In this inequality, q is a large positive integer. In one embodiment, q can be set equal to $M_L$, which represents the total number of components for the circuit design. The invention is not limited in this regard, however, as other values can be used. From this constraint, it can be seen that if $$\sum n_{ij}^k > 0,$$

then $X_{ij}$ is forced to a value of 1 by the right-hand side of the inequality. If, however, $$\sum n_{ij}^k = 0,$$

then the left-hand side of the inequality forces $X_{ij}$ to a value of 0. Accordingly, $X_{ij}$ can be used as an indicator of the presence of any clock load of clock network i in virtual clock region $V_j$.

Yet another set of ILP constraints relate to integrality. The constraints can be expressed as follows: $n_{ij}^k, Y_j \in Z$, where Z is the set of integers; $n_{ij}^k, Y_j \geq 0$; and $X_{ij} \in \{0,1\}$.

In step 135, an objective function F can be defined which can be used in solving the ILP formulation of the clock placing problem. In one embodiment, the objective function can be expressed as the sum of two different functions. Thus, the objective function can be expressed as F=F1+c*F2. In this embodiment, F1 can be a function which seeks to minimize the number of physical clock regions used by all global clock networks. In that case, F1 can be defined as $$F1 = \min \sum_{j=1}^{M_D} Y_j.$$

This is necessary to achieve a legal assignment of clocks in the PLD. Function F2 can seek to minimize the number of virtual clock regions used by a global clock network. The function F2 can be referred to as clock region compression. Function F2 can be defined as $$F2 = \min \sum_{i=1}^{M_D} \sum_{j=1}^{M_D} X_{ij}.$$

The constant c can be a tunable parameter which can be set to different values. By altering the value of c, different clock placement solutions can be realized.

In illustration, if a circuit design has 8 global clock networks that must be assigned to a PLD with 8 physical clock regions, several feasible solutions can be determined. For purposes of this example, it can be assumed that all clock networks have the same number of loads, equal to the capacity of a single physical clock region. A first feasible solution can be to place ⅛ of each global clock network into each virtual clock region. This solution produces a maximum of overlap between the global clock networks as well as maximum spread for each global clock network. A second feasible solution is to place each global clock network within its own virtual clock region. This solution produces no overlap and minimum spread.

Both solutions utilize 8 physical clock regions and are identical with respect to F1. The first solution is consistent with a value of c that is small. It should be appreciated that if c=0, then F=F1. In such an embodiment, F2 is optional. The second solution, in which c≠0 and F2 remains in the objective function, has a stronger likelihood of utilizing smaller wire lengths. By allowing a user to increase the value of c, the importance of F2 can be increased. In any case, a value of c can be selected by a user or a default value can be used.

In step 140, the ILP problem can be solved. The ILP problem can be solved through the use of an ILP solver. The various ILP constraints described herein can be loaded into the ILP solver to determine a solution. Available ILP solvers can include, but are not limited to, LP_Solve, which is a free solver, and the solver available under the GNU Scientific Library. Other commercial solvers also are available and it should be appreciated that the present invention is not limited by the particular brand and/or type of ILP solver used.

In step 145, a determination can be made as to whether the solution is a feasible one. The solution can be considered feasible if the sum of all physical clock regions of the PLD that are needed or used by the global clock networks of the circuit design is less than or equal to the number of physical clock regions in the device, which can be denoted as $\Sigma Y_j \leq N_R$. If $\Sigma Y_j \leq N_R$ is true, the method can proceed to step 155. If not, the clock placement problem for the circuit design is an infeasible one and the method proceeds to step 150.

In step 150, a report indicating why the solution is infeasible can be provided. The report can specify any computational results including, but not limited to, violated ILP constraints. Continuing with step 155, in the case where a feasible solution is determined, each virtual clock region can be mapped to a physical clock region. Each virtual clock region can include 0 or more physical clock regions. Each physical clock region associated with a virtual clock region then can be assigned to a real clock region on the device. The assignment could be performed using different methodologies such as a bipartite-matching technique or algorithm, or by assigning the physical clock regions to the real clock region based on the real clock region order in the device.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program, software, application, or any variant thereof, in the present context, means any expression, in any language, code or notation, of a set of instructions intended to cause a system having an information processing capability to perform a particular function either directly or after either or both of the following: a) conversion to another language, code, or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of global clock placement for a circuit design to be implemented on a programmable logic device (PLD) comprising:
   identifying properties of a plurality of global clock networks for the circuit design;
   identifying attributes of a plurality of physical clock regions for the PLD;
   specifying an Integer Linear Programming formulation (ILP) of a clock placement problem for the circuit design according to the properties of the plurality of global clock networks and attributes of the plurality of physical clock regions; and
   solving the ILP formulation to determine whether a feasible clock placement exists for the circuit design.

2. The method of claim 1, wherein the properties of the plurality of global clock networks for the circuit design are selected from the group consisting of a total number of global clock networks in the circuit design, a number of loads for each global clock network, different types of loads for each global clock network, and a total number of components in the circuit design.

3. The method of claim 1, said specifying step comprising defining the ILP formulation to depend upon an objective function which minimizes physical clock regions used by all global clock networks of the circuit design.

4. The method of claim 1, further comprising defining at least one virtual clock region which comprises at least one physical clock region, wherein the ILP formulation minimizes physical clock regions included within each virtual clock region.

5. The method of claim 4, further comprising mapping each virtual clock region to zero or more of the plurality of physical clock regions if a feasible clock placement exists for the circuit design.

6. The method of claim 4, said specifying step further comprising defining the ILP formulation to depend upon an objective function comprising a sum of a first and a second function, wherein the first function minimizes a total number of physical clock regions and the second function minimizes virtual clock regions used by global clock networks of the circuit design.

7. The method of claim 6, wherein the second function has a coefficient which regulates distribution of global clock networks among the plurality of physical clock regions of the PLD.

8. A method of global clock placement for a circuit design to be implemented on a programmable logic device (PLD) comprising:
   identifying clock properties for the circuit design and attributes of physical clock regions of the PLD;
   creating virtual clock regions according to clock properties of the circuit design;
   defining an Integer Linear Programming (ILP) formulation of a clock placement problem for the circuit design according to clock properties of the circuit design and attributes of physical clock regions of the PLD; and
   solving the ILP formulation by minimizing an objective function, which depends upon a sum of the physical clock regions of the PLD within each virtual clock region of the circuit design, to determine feasibility of global clock placement for the circuit design.

9. The method of claim 8, wherein the objective function depends upon a sum of a first and a second function, wherein the first function minimizes the sum of the physical clock regions of the PLD within each virtual clock region of the circuit design and the second function minimizes a sum of virtual clock regions used by global clock networks of the circuit design.

10. The method of claim 8, further comprising mapping each virtual clock region to zero or more one physical clock regions of a set of physical clock regions for the PLD if a feasible clock placement exists for the circuit design.

11. A method of assigning clocks to physical clock regions for a circuit design to be implemented on a programmable logic device (PLD), said method comprising:
identifying clock properties for the circuit design and physical clock region attributes for the PLD;
creating virtual clock regions according to clock properties of the circuit design;
specifying a plurality of Integer Linear Programming (ILP) constraints for determining feasibility of clock placement for the circuit design according to the clock properties and the physical clock region attributes; and
solving an objective function according to the ILP constraints to determine the feasibility of clock placement for the circuit design in relation to the PLD.

12. The method of claim 11, said specifying step further comprising defining an ILP constraint as $$\sum_{j=1}^{M_D} n_{ij}^k = A_i^k, \forall k, i,$$

wherein $A_i^k$ represents a number of clock loads of a type k belonging to a clock network i, $n_{ij}^k$ represents a number of clock loads of a type k driven by a clock driver i in a virtual clock region j, and $M_D$ represents a number of global clock networks in the circuit design.

13. The method of claim 11, said specifying step further comprising defining an ILP constraint as $$\sum_{i=1}^{M_D} n_{ij}^k \leq T_k Y_j, \forall k, j,$$

wherein $Y_j$ represents a number of physical clock regions comprising a virtual clock region j, $n_{ij}^k$ represents a number of clock loads of a type k driven by a clock driver i in a virtual clock region j, $T_k$ represents a number of available sites of a type k within a specified physical clock region, and $M_D$ represents a number of global clock networks in the circuit design.

14. The method of claim 11, said specifying step further comprising defining an ILP constraint as $$\sum_{j=1}^{M_D} X_{ij} \geq 1, \forall i,$$

wherein $X_{ij}$ is a binary variable representing a presence of any component driven by a clock network i in a virtual clock region j, and $M_D$ represents a number of global clock networks in the circuit design.

15. The method of claim 11, said specifying step further comprising defining an ILP constraint as $$\sum_{i=1}^{M_D} X_{ij} \leq N_C, \forall j,$$

wherein $X_{ij}$ is a binary variable representing a presence of any component driven by a clock network i in a virtual clock region j, $N_C$ represents a maximum number of global clock trees allowed in a physical clock region, and $M_D$ represents a number of global clock networks in the circuit design.

16. The method of claim 11, said specifying step further comprising defining an ILP constraint as $$q\sum_k n_{ij}^k \geq qX_{ij} \geq \sum_k n_{ij}^k, \forall i, j,$$

wherein $n_{ij}^k$ represents a number of clock loads of a type k driven by a clock driver i in a virtual clock region j, $X_{ij}$ is a binary variable representing a presence of any component driven by a clock network i in a virtual clock region j, and q is a positive integer.

17. The method of claim 11, said specifying step further comprising defining a plurality of ILP constraints as $n_{ij}^k$, $Y_j \in Z$, $n_{ij}^k, Y_j \geq 0$, and $X_{ij} \in \{0,1\}$, wherein $n_{ij}^k$ represents a number of clock loads of a type k driven by a clock driver i in a virtual clock region j, $Y_j$ represents a number of physical clock regions comprising a virtual clock region j, Z is the set of integers, and $X_{ij}$ is a binary variable representing a presence of any component driven by a clock network i in a virtual clock region j.

18. The method of claim 11, wherein the objective function F is defined as $$F = \left[\min \sum_{j=1}^{M_D} Y_j\right] + c\left[\min \sum_{i=1}^{M_D} \sum_{j=1}^{M_D} X_{ij}\right],$$

wherein $Y_j$ represents a number of physical clock regions comprising a virtual clock region j, $X_{ij}$ is a binary variable representing a presence of any component driven by a clock network i in a virtual clock region j, $M_D$ represents a number of global clock networks in the circuit design, and c is a constant which regulates distribution of clocks of the circuit design among physical clock regions of the PLD.

19. The method of claim 18, further comprising setting c to be equal to 0 or a positive quantity.

20. The method of claim 11, further comprising determining that clock placement for the circuit design is feasible if a solution for the objective function F satisfies $\Sigma Y_j \leq N_R$, wherein $Y_j$ represents a number of physical clock regions comprising a virtual clock region j and $N_R$ represents a number of physical clock regions in the PLD.

* * * * *